United States Patent [19]

McMichen et al.

[11] Patent Number: 5,270,903
[45] Date of Patent: Dec. 14, 1993

[54] PRINTED CIRCUIT BOARD MANUFACTURING METHOD ACCOMMODATES WAVE SOLDERING AND PRESS FITTING OF COMPONENTS

[75] Inventors: T. Blane McMichen, Sagamore Beach; Kerry J. McMullen, Medway; John A. Sudanowicz, III, Medway, all of Mass.

[73] Assignee: Codex Corporation, Mansfield, Mass.

[21] Appl. No.: 995,560

[22] Filed: Dec. 22, 1992

Related U.S. Application Data

[60] Continuation of Ser. No. 785,363, Oct. 30, 1991, abandoned, which is a division of Ser. No. 580,408, Sep. 10, 1990, Pat. No. 5,092,035.

[51] Int. Cl.$^5$ .................... H05K 3/30; H05K 3/32; H05K 3/34; H05K 7/10
[52] U.S. Cl. ................... 361/760; 29/837; 29/840; 174/261; 174/262; 174/263; 228/180.1; 439/55; 361/748; 361/767; 361/807; 361/808
[58] Field of Search ............. 29/834, 837, 840, 845; 228/180.1; 174/261, 262; 361/397, 400, 403, 417, 418, 419, 420; 439/55, 83, 876

[56] References Cited

U.S. PATENT DOCUMENTS

| | | | |
|---|---|---|---|
| 3,528,173 | 9/1970 | Gall | 361/403 |
| 3,745,513 | 7/1973 | Gross | 174/261 |
| 4,086,426 | 4/1978 | Knappenberger | 174/261 |
| 4,185,378 | 1/1980 | Machida | 361/403 |
| 4,295,184 | 10/1981 | Roberts | 361/403 |
| 4,373,259 | 2/1983 | Motsch | 228/180.1 |
| 4,739,919 | 4/1988 | Van Den Brekel et al. | 228/180.1 |
| 4,970,624 | 11/1990 | Arneson et al. | 174/262 |
| 4,982,376 | 1/1991 | Megens et al. | 361/400 |

FOREIGN PATENT DOCUMENTS

| | | | |
|---|---|---|---|
| 2416869 | 10/1975 | Fed. Rep. of Germany | 29/837 |
| 2827640 | 1/1980 | Fed. Rep. of Germany | 29/837 |
| 2833480 | 2/1980 | Fed. Rep. of Germany | 439/55 |
| 3151656 | 7/1983 | Fed. Rep. of Germany | 439/55 |
| 3411031 | 9/1985 | Fed. Rep. of Germany | 29/837 |
| 1428534 | 10/1988 | U.S.S.R. | 228/180.2 |

OTHER PUBLICATIONS

IBM Technical Disclosure Bulletin "Circuit Board Connective Scheme" by Roche et al. vol. 6 No. 8 Jan. 1964.
Western Electric "Attaching Leads To Flexible Substrates" by A. F. Glaubke Tech. Digest No. 52 Oct. 1978.

Primary Examiner—Leo P. Picard
Assistant Examiner—Donald A. Sparks
Attorney, Agent, or Firm—Darleen J. Stockley

[57] ABSTRACT

A first set of plated-through holes in the printed circuit board (PCB) are covered by a protective solder mask on the solder side of the PCB while a second set of plated-through holes are exposed. Electrical components are disposed on the component side with leads inserted in the second set of holes. Solder is prevented from flowing into the first set of holes during wave soldering by the mask covering. Conductive pins designed for press fitting into the first set of holes are inserted therethrough to define connecting pins on each side of the PCB following wave soldering. This permits both a wave soldering and press fit operation to be accommodated.

1 Claim, 1 Drawing Sheet

PRINTED CIRCUIT BOARD MANUFACTURING METHOD ACCOMMODATES WAVE SOLDERING AND PRESS FITTING OF COMPONENTS

This is a continuation of application Ser. No. 07/785,363, filed Oct. 30, 1991 and now abandoned, which is a division, of application Ser. No. 07/580,408, filed Sep. 10, 1990 now U.S. Pat. No. 5,092,035.

BACKGROUND OF THE INVENTION

This invention is generally directed towards a method for assembling components on a printed circuit board (PCB) and more specifically addresses a method that permits the efficient utilization of press fit technology and wave soldering. This invention also address a PCB assembly made utilizing this process.

Wave soldering components to a PCB is generally known. Components are assembled onto one surface of the PCB with their leads projecting down through metalized holes to the solder side of the PCB. The PCB is held along its edges by a holding fixture and is carried by a conveyor so that the solder side surface of the PCB engages and passes through a wave of molten solder. It will be apparent that anything disposed on the solder side of the PCB must have sufficient characteristics to withstand the wave soldering operation.

Certain components and assemblies are inherently not suited for wave soldering. One such problem is presented when the PCB is utilized to provide connections with other assemblies on both surfaces of the PCB such as by the use of pins which project from both surfaces. If such pins are inserted prior to wave soldering, the portion of the pin projecting from the solder surface will be soldered. This is undesirable in many applications where connecting reliability is important. Such pins often have a special coating, such as gold plating, to enhance the reliability of connections which would be defeated by a coating of solder. Although it is possible to use a custom shield or cover to prevent solder from engaging the pins, undesirable results often occur. Such a technique usually requires substantial manual operations and results in manufacturing defects.

A PCB known as a backplane can be utilized to interconnect other cards and assemblies. Such backplanes typically have rows of pins which project beyond both surfaces of the PCB allowing the connection of other assemblies or connectors. If components are mounted to the backplane that require soldering, they are typically soldered using a hand held soldering iron after such pins are inserted into the board.

There exists a need for a method which permits a PCB to accommodate interconnection pins which extend from both surfaces while also allowing the use of wave soldering to secure additional components. The present invention addresses this need.

DESCRIPTION OF A PREFERRED EMBODIMENT

Figure 1:
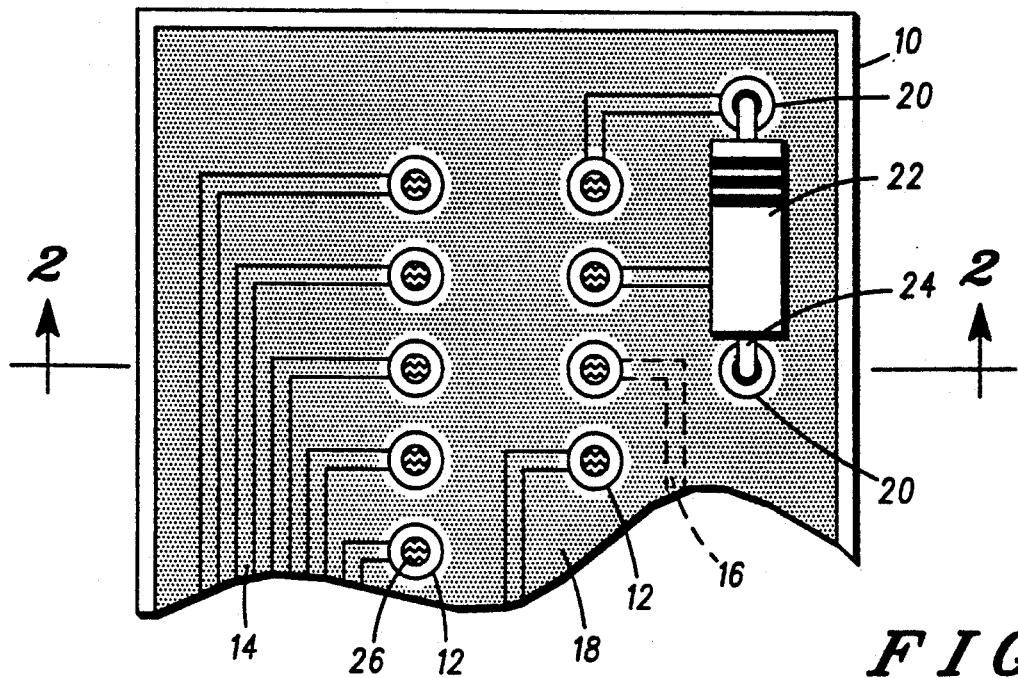
FIG. 1 illustrates a partial top view of a PCB in accordance with the present invention.
Figure 2:
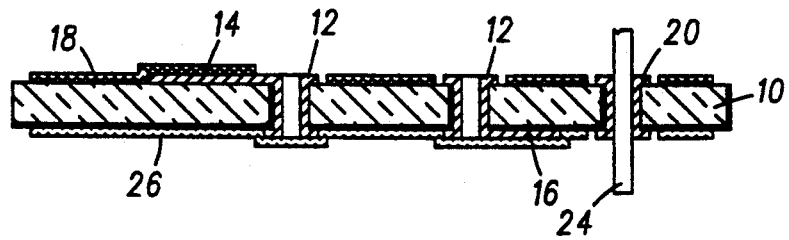
FIG. 2 is a cross sectional view as taken along line 2—2 in FIG. 1.

FIGS. 1 and 2 illustrate a PCB 10 in accordance with the present invention. It includes a number of plated-through holes 12 which may be arranged in rows to receive connector pins. A printed circuit board conductor 14 on the top surface of the PCB and 16 on the bottom surface of the PCB provide connections to other plated-through holes or components on the PCB. A solder mask 18 on the top surface of the PCB protects the PCB while exposing areas around the plated-through holes.

Additional plated-through holes 20 in the PCB are disposed to accept conventional components such as resistor 22 which has axial leads 24 formed to project through holes 20. It will be apparent that these exemplary figures are merely representative and that a plurality of conventional soldered-on components can be disposed on the top surface of the PCB in addition to connector pins.

The bottom or solder side of the PCB has a solder mask 26 which covers and protects the major areas of the PCB. However, in accordance with the present invention, this mask also covers plated-through holes 12 on the bottom surface of the PCB, but does not cover plated-through holes 20 which contain the leads of components or are otherwise desired to be soldered by wave soldering operation. The solder mask 26 may consist of a dry film mask material, such as Vacrel available from DuPont which can be applied as a 0.004 inch thick film. It is desired that this film be capable of "tenting" or bridging across holes 12.

Figure 3:
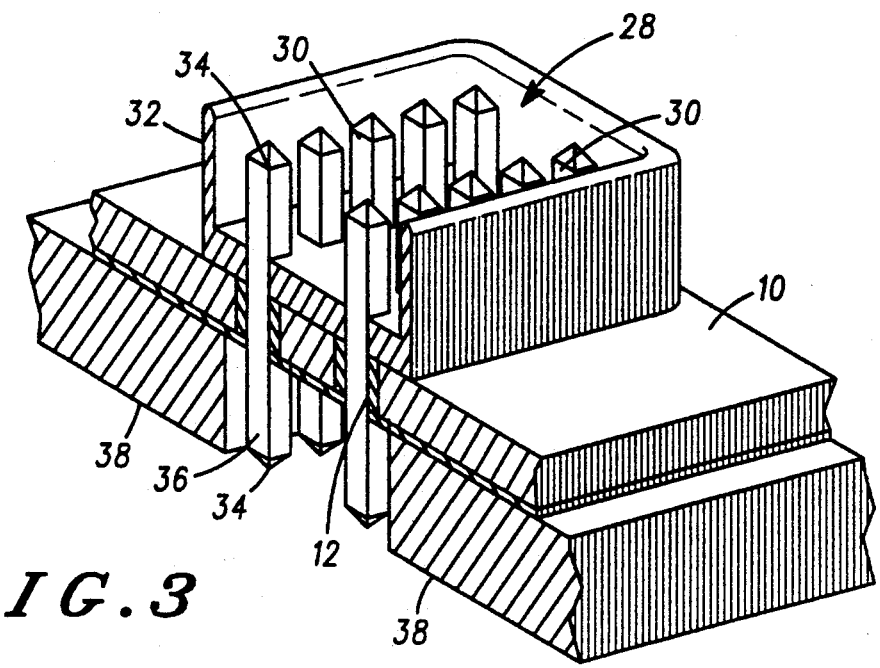
FIG. 3 is a partial perspective view of a PCB illustrating a press fit connector inserted in accordance with the present invention.

FIG. 3 illustrates a PCB 10 wherein a connector assembly 28 is mounted to the top surface of the PCB. The assembly includes metal pins 30 which are mounted to and project from connector housing 32. The pins preferably have a square cross section and are chamfered at each end 34. The pins have a cross sectional dimension to allow a press fit insertion into holes 12 thereby establishing electrical connection and mechanical mounting to the PCB. Portions 36 of the pins project substantially beyond the solder side surface of PCB 10 to permit engagement with connectors or assemblies.

In accordance with the method according to the present invention, a PCB is first fabricated to contain appropriately located plated-through holes 12 and 20. Next, the top surface solder mask 18 and bottom surface solder mask 26 are applied. It is important that the bottom side mask 26 completely cover plated-through holes 12 while exposing plated-through holes 20 which are to receive the leads of components to be soldered. Such components are then disposed on the top surface of the PCB with their leads projecting through plated-through holes 20 in a conventional manner.

The PCB with inserted components is then wave soldered by passing the entire bottom surface of the PCB through a wave solder operation using a conventional conveyor carrying technique. The result of this operation is that the inserted components are soldered at plated-through holes 20 and that holes 12 exit the solder wave with no solder being applied to these holes because of the protection afforded by mask 26. The heat associated with the wave soldering operation advantageously makes the mask layer 26 covering holes 12 more brittle.

Following the wave soldering operation, the PCB is placed on a holding fixture 38 which is disposed to support the bottom of the PCB while the connector assembly 28 is press fit from the top surface of the PCB so that pins 30 project through holes 12. The ends 34 of these pins readily puncture and break the relatively brittle solder mask 26 covering the solder side ends of holes 12. The fixture 38 has reliefs or recesses to accommodate any leads 24 which may be projecting from other components mounted on the PCB and provides appropriate support adjacent the holes 12 during the press fit operation. This completes the assembly of the PCB in accordance with the present invention whereby components are wave soldered and projecting solder side connector pins are accommodated without compromising the wave soldering operation.

This method is advantageous in that it allows components to be wave soldered to a PCB without interfering with the later mounting of a connector with pins which project through the PCB. Thus, the reliability of wave soldering is provided for conventional components while the reliability and convenience of press fitting a connector with pins into the PCB is maintained.

It is believed to be desirable to mount the connector assembly 28 from the top surface of the printed circuit board so that the portions of the solder mask 26 covering the ends of holes 12 are broken outward and away from the PCB. However, in certain situations it may be desirable or a requirement to insert the pins from the solder surface thereby breaking the solder mass inward into the holes. Alternatively, a rod could be inserted through the holes 12 to break the solder mask and then removed prior to insertion of the connector pins.

It will be apparent to those skilled in the art that other modifications can be made. For example, a connector housing substantially identical to housing 32 could be mounted to the portions 36 of pins 30 on the solder side of the PCB to aid in engaging and holding a mating connector or assembly.

Although an embodiment of the present invention has been described and illustrated in the drawings, the scope of the invention is to defined by the claims which follow.

What is claimed is:

1. A printed circuit board (PCB) assembly comprising:
    a substantially non-conductive substrate;
    a first and second set of plated-through holes in said substrate;
    said substrate having a component side and a solder side;
    conductors formed on at least one of said sides of the substrate;
    a nonconductive mask layer disposed on said solder side of the substrate such that said first set of holes are covered and said second set of holes are exposed;
    components disposed on said component side of said substrate with component leads wave soldered into said second set of holes;
    conductive pins disposed in said first set of holes with a substantial portion projecting beyond said component and solder side of said substrate, said nonconductive mask layer covering said first set of holes being broken away as said pins project through said first set of holes.

* * * * *